United States Statutory Invention Registration [19]

[11] Reg. Number: H695

Weiner et al. [43] Published: Oct. 3, 1989

[54] HIGH ENERGY OPTICALLY CONTROLLED KILOVOLT SEMICONDUCTOR SWITCH

[75] Inventors: Maurice Weiner, Ocean; Lawrence J. Bovino, Eatontown; Terence Burke, Ocean; Anderson H. Kim, Eatontown, all of N.J.

[73] Assignee: The United States of America as represented by the Secretary of the Army, Washington, D.C.

[21] Appl. No.: 111,746

[22] Filed: Oct. 23, 1987

[51] Int. Cl.[4] ..... H01L 27/14; H01J 40/14
[52] U.S. Cl. ..... 357/30; 250/211 J
[58] Field of Search ..... 250/211 J, 551; 357/30 B, 30 P, 30 Q

[56] References Cited

U.S. PATENT DOCUMENTS

| | | | |
|---|---|---|---|
| 3,399,313 | 8/1968 | Sawyer | 357/30 P X |
| 4,218,618 | 8/1980 | Mourou | 250/211 J |
| 4,240,088 | 12/1980 | Myers | 250/551 X |
| 4,348,546 | 9/1982 | Little | 357/30 Q X |

*Primary Examiner*—Stephen C. Buczinski

*Assistant Examiner*—Linda J. Wallace

*Attorney, Agent, or Firm*—Sheldon Kanars; Roy E. Gordon

[57] ABSTRACT

A high energy, optically controlled kilovolt semiconductor switch is provided including a bulk piece of high resistivity semiconductor for illumination by a high speed laser, said semiconductor having a thick highly doped epitaxial layer of P+ impurity grown on one side of the semiconductor, and a thick highly doped epitaxial layer of N+ impurity grown on the opposite side of the semiconductor with metallic electrodes deposited on the respective epitaxial layers using standard ohmic contact procedures.

11 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HIGH ENERGY OPTICALLY CONTROLLED KILOVOLT SEMICONDUCTOR SWITCH

The invention described herein may be manufactured, used, and licensed by or for the Government for governmental purposes, without the payment to me of any royalty thereon.

This invention relates in general to a high energy, optically controlled, kilovolt semiconductor switch, and in particular to such a switch for use in microwave and laser transmitters. By optically controlled is meant either carrier generation due entirely to an optical signal or carrier generation due to a "seed" optical signal and avalanche multiplication of the "seed" carrier.

BACKGROUND OF THE INVENTION

In recent years, major advances in kilovolt, photoconductive semiconductor switches have been achieved, using semiinsulating high resistivity gallium arsenide as the semiconductor material As the name implies, switching is achieved when the semiconductor is illuminated, usually in the form of light energy emanating from a laser as for example, Nd:YAG laser and laser diodes. An important concern in such switches is the high voltage blocking capability. Depending on the gap length between electrodes of 0.5 to 10 mm, the semiconductor must hold off one to fifty kilovolts and conduct currents ranging from tens to thousands of amperes. The combination of electric field stress and current often results in a destructive avalanche or breakdown of the device. One of the factors contributing to the destructive avalanche is the intense electric field that exists at or very near the electrodes. Any micro- protrusion at the electrode as caused for example, by a fissure in the material, serves as a potential initiator of a filamentation channel, arising from the field re-enforcement at the site of the electrode defect. Typically, the large current densities at the microprotrusion melts the electrode material, and this produces a filamentary, conducting channel in the semiconductor. Thereafter, the switch loses its voltage hold-off capability and the semiconductor can no longer function as a switch.

SUMMARY OF THE INVENTION

The general object of this invention is to provide an improved high energy, optically controlled, kilovolt semiconductor switch for use in microwave and laser transmitters. A further object of the invention is to provide such a switch that provides improved high voltage capability and efficiency, while maintaining sub-nanosecond switching speed and complete high voltage isolation It has now been found that the aforementioned objects can be attained by the introduction of thick, doped epitaxial layers into the photoconductive semiconductor.

More particularly, according to the invention, thick highly doped epitaxial layers are grown on opposite sides of a bulk piece of high resistivity semiconductor as for example, gallium arsenide, using vapor or liquid deposition techniques. A typical thickness for the epitaxial layer is in the 10 to 100 micron range. One side of the gallium arsenide is doped with a P+ impurity while the opposite side is doped with N+ impurity. Typical doping densities fall in the $10^{14}$ to $10^{17}cm^{-3}$ range The exact values of both the epitaxial thickness and the doping density depend on voltage bias and other parameters. Metallic electrodes are then deposited on the epitaxial layers using standard ohmic contact procedures for gallium arsenide. As a result of the introduction of the epitaxial layers, the electric field profiles change dramatically.

DESCRIPTION OF THE DRAWING

Referring to FIG. 1, without the epitaxial layers, the field is practically uniform throughout the semiconductor 11.

Referring to FIG. 2, the addition of the doped layers 13, 15 causes the field to drop close to zero near the boundary of the epitaxial layer. The epitaxial regions therefore succeed in removing the fields a substantial distance away from the electrodes 17, 19. The light 23 is shown entering perpendicular to the current flow in the semiconductor 11.

Referring to FIG. 3, one of the electrodes 17' is gridded, and the light 23 enters the semiconductor 11 through the grid apertures 21. Such an arrangement allows the transverse dimension D of the semiconductor 11 (perpendicular to the current flow) to extend well beyond the electrode 17, 19 dimensions. Such a design helps to prevent surface breakdown, particularly for gap lengths 155 1.0 mm.

Figure 1:
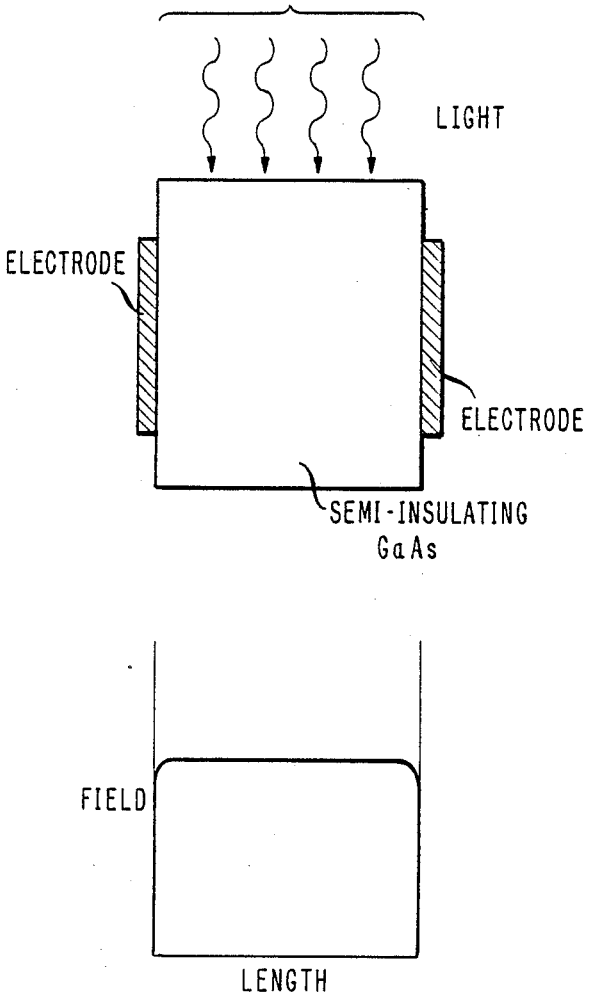
FIG. 1 shows a semi-insulating GaAs switch structure and field profile.
Figure 2:
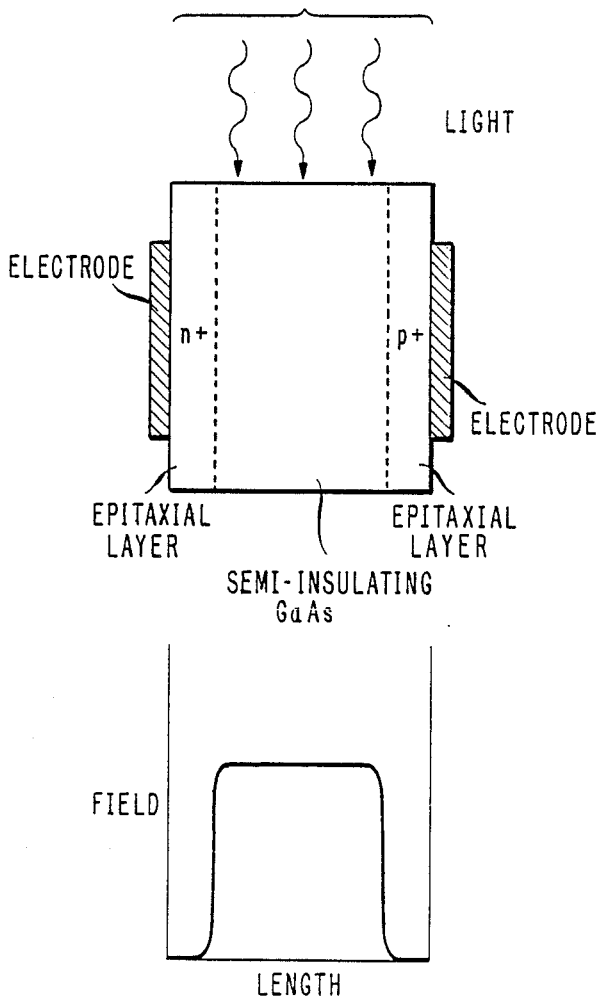
FIG. 2 shows a GaAs switch structure with the addition of epitaxial layers and the corresponding field profile. The thickness of the epitaxial layers are exaggerated.
Figure 3:
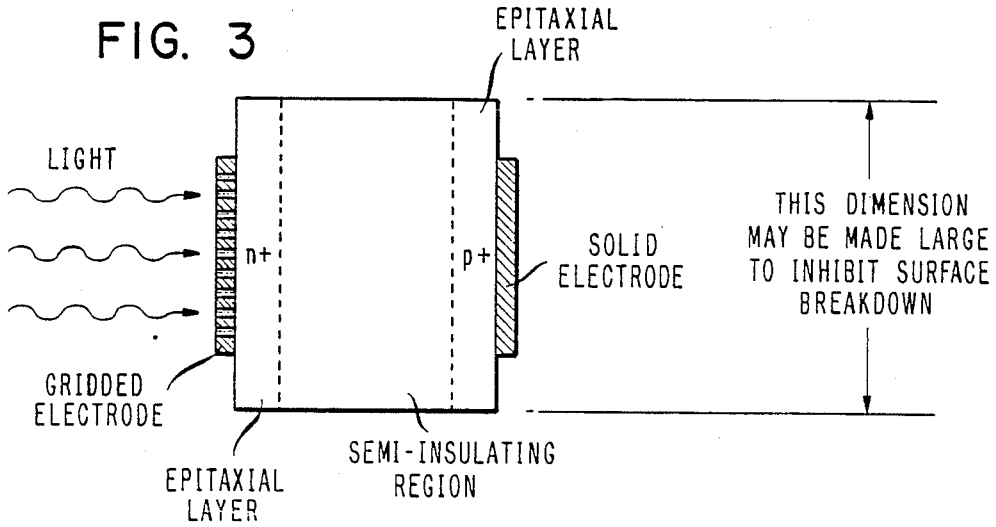
FIG. 3 shows a photoconductive GaAs switch with both epitaxial layers and gridded electrode.

The epitaxial layers also serve an additional purpose. Photo-conductive carrier generation in semi-insulating gallium arsenide arises from "EL-2" traps, which are quite numerous ($\sim 10^{16}cm^{-3}$) The traps are produced during the growth process (either Czchrolski or Bridgeman). In epitaxial grown layers, however, the traps are far less numerous. The carrier generation thus is restricted to the semi-insulating region, which is also the region supporting the field This is generally desirable from an efficiency standpoint.

The introduction of thick, doped epitaxial layers in photo-conductive gallium arsenide switches significantly improve the operation of the switch. The removal of the fields away from the electrodes enables the switch to operate at higher electric fields without causing electrode sputtering, and subsequent filamentation breakdown. By confining the fields to the interior of the semiconductor, chances are improved of producing a controllable non-destructive avalanche. This allows the switch to operate with a minimum of light energy, thus improving the overall efficiency. Also, the selective absorption and carrier generation in the semi- insulating region, which coincides with the electric field drift region, makes the best use of the light energy, and the efficiency.

In summary, the new switch structure results in improved voltage capability and greater efficiency.

We wish it to be understood that we do not desire to be limited to the exact details of construction shown and described for obvious modifications will occur to a person skilled in the art.

What is claimed is:

1. A high energy, optically controlled kilovolt semiconductor switch comprising a bulk piece of high resistivity semiconductor for illumination by a high speed laser, said semiconductor having a thick highly doped epitaxial layer of P+ impurity grown on one side of the semiconductor, and a thick highly doped epitaxial layer of N+ impurity grown on the opposite side of the semiconductor with metallic electrodes deposited on the respective epitaxial layers.

2. A high energy optically controlled kilovolt semiconductor switch according to claim 1 wherein the epitaxial layers are grown by vapor deposition techniques.

3. A high energy optically controlled kilovolt semiconductor switch according to claim 1 wherein the epitaxial layers are grown by liquid deposition techniques.

4. A high energy optically controlled kilovolt semiconductor switch according to claim 2 wherein each epitaxial layer has a thickness of about 10 to 100 microns.

5. A high energy optically controlled kilovolt semiconductor switch according to claim 3 wherein each epitaxial layer has a thickness of about 10 to 100 microns.

6. A high energy optically controlled kilovolt semiconductor switch according to claim 4 wherein the doping densities range from about $10^{14}$ to $10^{17}cm^{-3}$.

7. A high energy optically controlled kilovolt semiconductor switch according to claim 5 wherein the doping densities range from about $10^{14}$ to $10^{17}cm^{-3}$.

8. A high energy optically controlled kilovolt semiconductor switch according to claim 1 wherein the semiconductor is gallium arsenide.

9. A high energy optically controlled kilovolt semiconductor switch according to claim 1 wherein the laser light enters perpendicular to the current flow in the semiconductor.

10. A high energy optically controlled kilovolt semiconductor switch according to claim 1 wherein one of the electrodes is gridded and the light enters the semiconductor through the grid apertures.

11. A high energy optically controlled kilovolt semiconductor switch for illumination by a high speed laser comprising a bulk piece of high resistivity gallium arsenide having a thick highly doped epitaxial layer of P+ impurity grown on one side of the gallium arsenide, and a thick highly doped epitaxial layer of N+ impurity grown on the opposite side of the gallium arsenide, wherein each of the epitaxial layers are grown by vapor deposition techniques and wherein each of the epitaxial layers has a thickness of about 10 to 100 microns and wherein the doping densities range from about $10^{14}$ to $10^{17}cm^{-3}$ with metallic electrodes deposited on the respective epitaxial layers and wherein one of the electrodes is gridded and the light enters the semiconductor through the grid apertures.

* * * * *